United States Patent
Van Der Tempel

(10) Patent No.: US 11,550,060 B2
(45) Date of Patent: Jan. 10, 2023

(54) IMAGING PORTION, TIME-OF-FLIGHT DEVICE AND METHOD

(71) Applicant: Sony Semiconductor Solutions Corporation, Kanagawa (JP)

(72) Inventor: Ward Van Der Tempel, Muizen (BE)

(73) Assignee: Sony Semiconductor Solutions Corporation, Kanagawa (JP)

( * ) Notice: Subject to any disclaimer, the term of this patent is extended or adjusted under 35 U.S.C. 154(b) by 486 days.

(21) Appl. No.: 16/829,648

(22) Filed: Mar. 25, 2020

(65) Prior Publication Data
US 2020/0309956 A1    Oct. 1, 2020

(30) Foreign Application Priority Data
Mar. 25, 2019  (EP) ..................................... 19164979

(51) Int. Cl.
| | | |
|---|---|---|
| *G01S 17/894* | (2020.01) | |
| *G01S 7/4863* | (2020.01) | |
| *G01S 7/4914* | (2020.01) | |
| *H01L 27/146* | (2006.01) | |
| *G01S 7/484* | (2006.01) | |
| *G01S 7/4865* | (2020.01) | |
| *G01S 7/481* | (2006.01) | |
| *G01S 17/10* | (2020.01) | |

(52) U.S. Cl.
CPC ............ *G01S 17/894* (2020.01); *G01S 7/484* (2013.01); *G01S 7/4816* (2013.01); *G01S 7/4863* (2013.01); *G01S 7/4865* (2013.01); *G01S 7/4914* (2013.01); *G01S 17/10* (2013.01); *H01L 27/14614* (2013.01)

(58) Field of Classification Search
CPC .... G01S 7/4816; G01S 7/4863; G01S 7/4914; G01S 17/894; H01L 27/14614
See application file for complete search history.

(56) References Cited

U.S. PATENT DOCUMENTS

| | | |
|---|---|---|
| 2017/0134675 A1 | 5/2017 | Hynecek |
| 2017/0280080 A1 | 9/2017 | Machida et al. |
| 2019/0075261 A1* | 3/2019 | Machida ................ H04N 5/369 |

FOREIGN PATENT DOCUMENTS

WO    WO 2015/170533 A1    11/2015

* cited by examiner

*Primary Examiner* — Thanh Luu
(74) *Attorney, Agent, or Firm* — Wolf, Greenfield & Sacks, P.C.

(57) ABSTRACT

The present disclosure provides an imaging portion for a time-of-flight device, which has:
at least one photo-detection element;
at least one overflow gate for the at least one photo-detection element;
at least one transfer gate configured to receive at least one transfer signal;
at least one transfer gate switch configured to couple or to decouple the at least one overflow gate and the at least one transfer gate in response to at least one transfer gate switch signal.

20 Claims, 5 Drawing Sheets

IMAGING PORTION, TIME-OF-FLIGHT DEVICE AND METHOD

CROSS-REFERENCE TO RELATED APPLICATIONS

The present application claims priority to European Patent Application 19164979.7 filed by the European Patent Office on Mar. 25, 2019, the entire contents of which being incorporated herein by reference.

TECHNICAL FIELD

The present disclosure generally pertains to an imaging portion for a time-of flight device, a time-of-flight device and a method.

TECHNICAL BACKGROUND

Generally, time-of-flight (ToF) devices are known, for example for imaging or creating depth maps of a scene, such as an object, a person, or the like. It can be distinguished between direct ToF (dToF) or indirect ToF (iToF) by measuring a distance either by measuring the run-time of emitted and reflected light (dToF) or by measuring one or more phase-shifts of emitted and reflected light (iToF).

In this process, charges are generated and measured by a photo-detection process in a photo-detection sensor of the time-of-flight device, which are dumped by modulating one or a plurality of, for example, transistor gates during an acquisition process, such as overflow gates.

Although there exist techniques for dumping charges in ToF devices, it is generally desirable to provide an imaging portion for a time-of-flight device, a time-of-flight device and a method.

SUMMARY

According to a first aspect, the present disclosure provides an imaging portion for a time-of-flight device, including: at least one photo-detection element; at least one overflow gate for the at least one photo-detection element; at least one transfer gate configured to receive at least one transfer signal; at least one transfer gate switch configured to couple or to decouple the at least one overflow gate and the at least one transfer gate in response to at least one transfer gate switch signal.

According to a second aspect, the present disclosure provides a time-of-flight device, comprising: an imaging portion including: at least one photo-detection element; at least one overflow gate for the at least one photo-detection element; at least one transfer gate configured to receive at least one transfer signal; at least one transfer gate switch configured to couple the at least one overflow gate and the at least one transfer gate in response to at least one transfer gate switch signal; and a control configured to generate the at least one transfer gate switch signal for driving the at least one transfer gate switch.

According to a third aspect, the present disclosure provides a method for operating a time-of-flight device, including: receiving at least one transfer signal by at least one transfer gate; coupling or decoupling at least one overflow gate and the at least one transfer gate in response to at least one transfer gate switch signal.

Further aspects are set forth in the dependent claims, the following description and the drawings.

BRIEF DESCRIPTION OF THE DRAWINGS

Embodiments and further technical background are explained by way of example with respect to the accompanying drawings, in which.

DETAILED DESCRIPTION OF EMBODIMENTS

Figure 4:
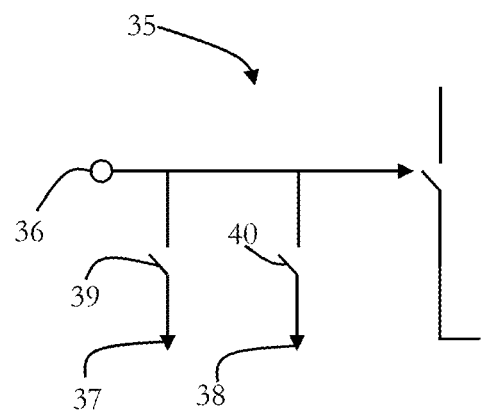
FIG. 4 shows a circuitry according to an embodiment of the present disclosure.

Before a detailed description of the embodiments under reference of FIG. 4 is given, general explanations are made.

As mentioned in the outset, for time-of-flight devices it is generally known that charges are generated and measured by a photo-detection process in a photo-detection sensor of the time-of-flight device, which are dumped by modulating one or a plurality of, for example, transistor gates during an acquisition process, such as overflow gates. Generally, for overflow gates it is known to only apply a low frequency signal. However, in some embodiments, a high frequency signal may be applied to an overflow gate, which may result in a deteriorated falling edge, as will also be explained further below under reference of FIG. 2. It has been recognized that by coupling a transfer gate signal to an overflow gate, the falling edge may be improved in some embodiments.

Consequently, some embodiments pertain to an imaging portion for a time-of-flight device, including: at least one photo-detection element; at least one overflow gate for the at least one photo-detection element; at least one transfer gate configured to receive at least one transfer signal; at least one transfer gate switch configured to couple the at least one overflow gate and the at least one transfer gate in response to at least one transfer gate switch signal.

The imaging portion may be a single component or a group of components of a time-of-flight system, for example an image sensor, photodiode, or the like, including or not including circuitry for control/read-out of the imaging portion and/or further signal processing. Also smaller or bigger elements of the components may be considered as an imaging portion, such as a single transistor or a group of transistors, a camera system, or the like.

The imaging portion may be based on any type of known sensing technology for time-of-flight systems and may be based on, for example, CMOS (complementary metal-oxide semiconductor), CCD (charge coupled device), SPAD (single photon avalanche diode), which may be used for dToF based technologies, CAPD (current assisted photodiode), which may be used for iToF based technologies, or the like.

Moreover, the imaging portion may include a single pixel as photo-detection element or multiple pixels as multiple photo-detection elements, which may be arranged in an array, as it is generally known in the art. Light detection, in particular, may have a small number of pixel (e.g. 64 by 64 pixels), but in other embodiments, the number of pixels may be smaller (e.g. 32×32, 16×16, 16×32, etc.) or larger (e.g. 128×128 pixels, 128×256, 256×256, etc.).

Moreover, the photo-detection elements may grouped in a predetermined group of photo-detection elements, e.g. pixels (for example four, eight, or the like), which are specifically arranged, for example in a row, in a column, in a square, in a rectangle, or the like.

In some embodiments, the photo-detection element(s) may be associated with a circuitry which is connected to a group of sub-pixels, sensors, or the like. For example, a circuitry configured to read out information produced by the photo-detection element may be connected to a group of pixels (for example two (sub-)pixels) included in the photo-detection element, and this group of pixels may be regarded as one photo-detection element.

The at least one overflow gate and the at least one transfer gate may be gates of transistors, or the like, configured to be controlled by a signal and, in response to the signal, to initiate a measurement cycle, to be integrated in a measurement cycle, to read out a voltage, read out a current, drain electrons, transfer the same signal or transfer, generate or control a second signal, or the like. In this context, the at least one transfer gate receives at least one transfer signal. Also at least one (i.e. one or multiple gates) may receive a single transfer signal, a subset of transfer signals or a plurality of transfer signal, wherein the number of transfer signals may be higher than the actual amount of transfer gates. For example one transfer gate may be configured to receive more than one transfer signals, or the like.

The transfer signal may be a signal which causes a charge to be transferred from the at least one photo-detection element to a charge-to-voltage converter (analog-to-digital converter), for example in time-of-flight systems based on CMOS technology, or the like, wherein a skilled person may apply similar techniques to other technologies.

The at least one transfer gate switch may be a switch, a relay, a contactor, or the like coupled to the at least one transfer gate, wherein in some embodiments not every transfer gate is coupled to a transfer gate switch, but, for example, a group of transfer gates is coupled to the transfer gate switch. In other embodiment, each transfer gate is connected to an associated transfer gate switch. In other embodiments, a transfer gate is coupled to a plurality of transfer gate switches or a plurality of transfer gate is coupled to a higher number of transfer gate switches, or the like.

The at least one transfer gate switch is configured to couple the at least one overflow gate to the at least one transfer gate. Moreover, the at least one transfer gate switch may be configured to decouple the at least one overflow gate to the at least one transfer gate. In some embodiments, not each transfer gate couples or decouples an overflow gate to a transfer gate. In some embodiments, a subset of overflow gates is not coupled to a transfer gate, whereas in other embodiments several overflow gates are coupled to a smaller number of transfer gates, or the like.

At least one transfer signal may include a first transfer signal configured to couple the at least one overflow gate to the at least one transfer gate and a second transfer signal configured to decouple the at least one overflow gate from the at least one transfer gate. In other embodiments, there may be individual transfer signals for coupling/decoupling each individual transfer gate to/from each overflow gate, or the like.

In some embodiments, the at least one overflow gate is driven with the at least one transfer signal.

The driving may be performed by a control, such as a processor, or the like, integrated in the imaging portion or outside of the imaging portion.

In embodiments in which the at least one overflow gate is coupled to the at least one transfer gate by the at least one transfer gate switch, the signal which drives the at least one transfer gate may be used to also drive the overflow gate. In some embodiments, the at least one transfer gate may be driven for a predetermined amount of time without driving the overflow gate at the same time, which corresponds to a decoupled state of the at least one transfer gate switch. The at least one transfer gate switch may be set in a coupled state after the predetermined amount of time (or any other desired point in time, e.g. also periodically, or the like) and the overflow gate may be driven with the at least one transfer signal.

In some embodiments, the at least one transfer gate switch signal is based on the at least one transfer signal.

The transfer gate switch signal may be set in a correspondence to the at least one transfer signal, e.g. if the transfer signal is set periodically, the transfer gate switch signal may correspond to times in which the transfer signal is on or off, thereby also including a periodicity. Also, the transfer gate switch signal may couple the at least one overflow gate to the at least one transfer gate in points in time in which a predetermined signal duration of the at least one transfer signal is reached. This may include every time the transfer signal is not driving the at least one transfer gate, the at least one transfer signal includes the at least one transfer gate switch signal which couples the at least one transfer gate to the at least one overflow gate in order to drive the at least one overflow gate, or vice versa.

In some embodiments, a first and a second transfer gate are provided; and a first and a second transfer gate switch are provided, wherein the first transfer gate switch is coupled to the first transfer gate and the second transfer gate switch is coupled to the second transfer gate; and wherein the first transfer gate switch and the second transfer gate switch are coupled to the at least one overflow gate.

In this context, the at least one overflow gate may be exactly one overflow gate (per photo-detection element). In some embodiments, however, this configuration may be used several times, for example there may be a total of three overflow gates each connected to two transfer gate (in total six transfer gates), wherein each transfer gate is coupled to a transfer gate switch, which may couple (or decouple) the transfer gates to the respective overflow gates.

In some embodiments, the first transfer gate is coupled, by the first transfer gate switch, to the at least one overflow gate when the second transfer gate is decoupled to the at least one overflow gate; and the second transfer gate is coupled, by the second transfer gate switch, to the at least one overflow gate when the first transfer gate is decoupled to the overflow gate.

In some embodiments, a first transfer signal is applied to the at least one overflow gate when the first transfer gate is coupled to the overflow gate; and a second transfer signal is applied to the at least one overflow gate when the second transfer gate is coupled to the overflow gate.

Thereby, the (at least one) overflow gate may be driven with the first transfer signal when the second transfer signal drives the second transfer gate and the at least one overflow gate may be driven with the second transfer signal when the first transfer signal drives the first transfer gate.

In some embodiments, the first transfer gate is coupled to the at least one overflow gate after a first predetermined amount of time after the second transfer gate has been decoupled from the at least one overflow gate; and the second transfer gate is coupled to the at least one overflow gate after a second predetermined amount of time after the first transfer gate has been decoupled from the at least one overflow gate.

In some embodiments, the first predetermined amount of time corresponds to the second predetermined amount of time. However, the first predetermined amount of time and the second predetermined amount of time may be different from each other, such as the first predetermined amount of time may be longer or shorter than the second predetermined amount of time, or the like.

In some embodiments, a plurality of photo-detection elements are arranged in an array, wherein, for example, for each of the photo-detection elements an transfer gate switch is provided or for a group of photo-detection elements.

The array may be an any kind of arrangement of the photo-detection elements, such as a linear, circular, rectangular, quadrangular, elliptical, or the like. However, the array is not limited to be a one-dimensional or two-dimensional array. Also, three dimensional arrangements are possible, such as cubicle, globular, or the like.

In some embodiments, and as indicated, for each of the photo-detection elements a transfer gate switch is provided, whereas in some embodiments for a group of photo-detection elements each a transfer gate switch is provided.

The group of photo-detection elements may be any number of photo-detection elements above one. However, there may also be a plurality of groups of photo-detection elements, wherein the groups of the plurality of groups of photo-detection elements do not necessarily need to have the same number of photo-detection elements included. For example, one of the plurality of groups may include two photo-detection elements, whereas another one of the plurality of groups may include three photo-detection elements or the like. The numbers chosen here are not limiting the present disclosure and are only for explanatory purposes.

Some embodiments pertain to a time-of-flight device, including an imaging portion as described herein, further including a control configured to generate the at least one transfer gate switch signal for driving the at least one transfer gate switch.

The control may be a control unit, such as a processor, FPGA (Field Programmable Gate Array), or the like. The control may also be a plurality of control units, such as a plurality of processors, FPGAs, or the like.

The control may be configured to perform the method discussed herein and as discussed in the following.

Some embodiments pertain to a method for operating an imaging portion for a time-of-flight device, as described herein, or for operating the time-of-flight device, as discussed herein. The method includes: applying at least one transfer signal to the at least one transfer gate; and applying at least one transfer gate switch signal to the at least one transfer gate switch for coupling the at least one overflow gate and the at least one transfer gate, as described herein.

Some embodiments include applying the at least one transfer signal to the at least one overflow gate, as described herein.

In some embodiments, the at least one transfer gate switch signal is based on the at least one transfer signal, as described herein In some embodiments, the imaging portion includes a first and a second transfer gate, and a first and a second transfer gate switch, and the method further includes: coupling the first transfer gate switch to the first transfer gate and the second transfer gate switch to the second transfer gate; and coupling the first transfer gate switch and the second transfer gate switch to the at least one overflow gate, as described herein Some embodiments further include coupling the first transfer gate to the at least one overflow gate when the second transfer gate is decoupled from the at least one overflow gate; and coupling the second transfer gate to the at least one overflow gate when the first transfer gate is decoupled from the at least one overflow gate, as described herein In some embodiments, the method further includes driving the at least one overflow gate when the first transfer gate is coupled to the at least one overflow gate; and driving the at least one overflow gate when the second transfer gate is coupled to the at least one overflow gate, as described herein.

Some embodiments pertain to coupling the first transfer gate to the at least one overflow gate after a first predetermined amount of time after the second transfer gate has been decoupled from the at least one overflow gate; and coupling the second transfer gate to the at least one overflow gate after a second predetermined amount of time after the first transfer gate has been decoupled from the at least one overflow gate, as described herein.

In the following, further general explanations are made under reference of FIG. 1.

Figure 1:
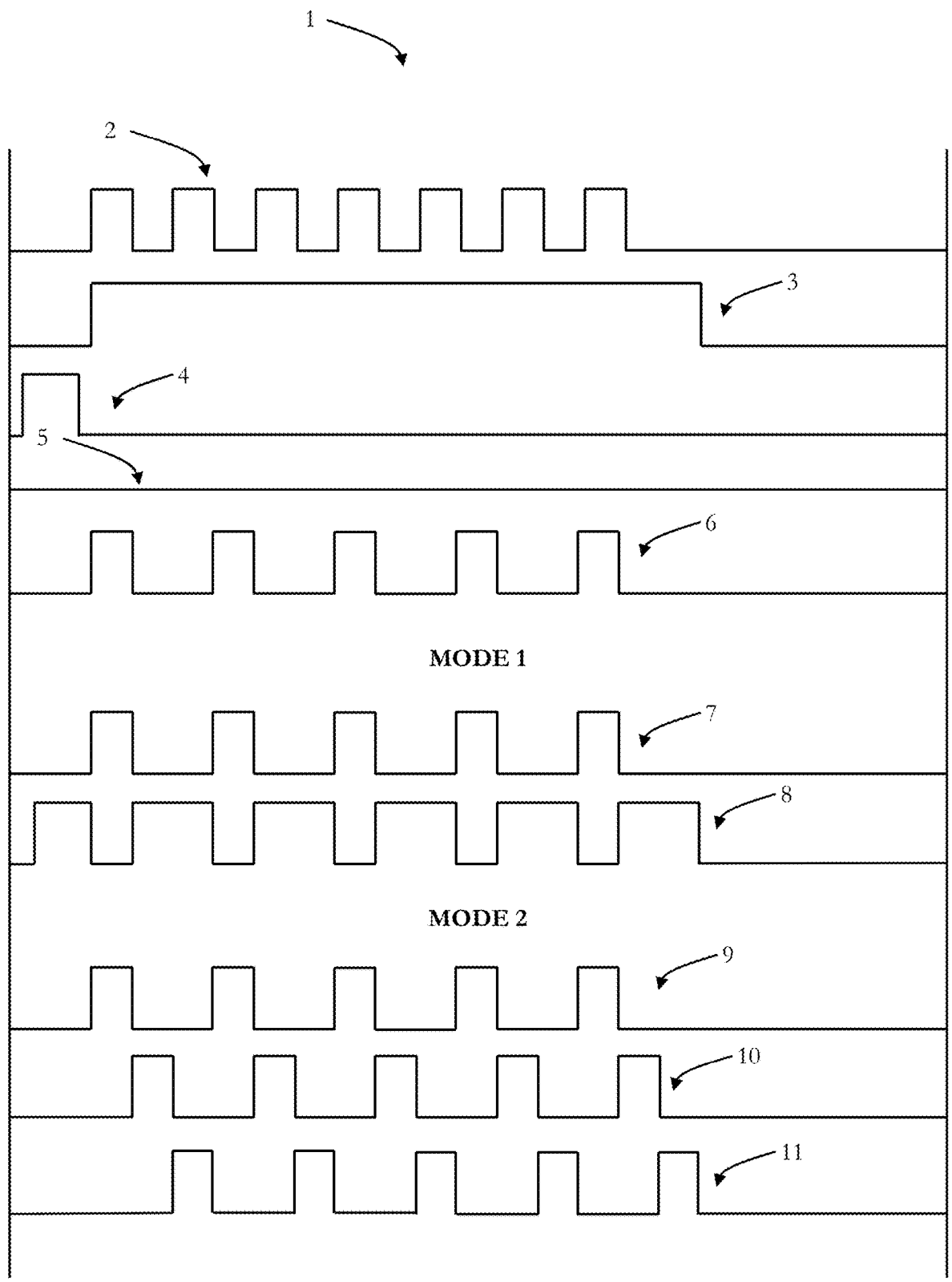
FIG. 1 shows a diagram generally illustrating signals which are implemented in some embodiments.

FIG. 1 shows time-dependent sequences 1 of different signals, wherein the signals are displayed as digital signals, i.e. either are turned on or turned off, for the sake of simplicity.

With reference number 2 a signal sequence of an illumination signal is denoted as it is known in the art, wherein the signal being in an on-state corresponds to the emittance of a light pulse. This signal sequence is displayed only for illustrational purposes, in specific for comparison with an illumination signal sequence 6 according to an embodiment of the present disclosure. From FIG. 1, it can be taken that the illumination signal sequence 6 includes that light pulses may be emitted less frequent than known in the art, therefore it may be concluded, if a signal is detected in an off-state of the illumination signal sequence 6, it may be reflected or origin from a distance farther away than a predetermined distance, which will be explained further below.

Reference number 4 denotes a reset signal, which may initiate a measurement cycle, a driving cycle, a synchronization, or the like.

Reference number 5 denotes a select signal configured to select a photo-detection element. In this embodiment, the select signal is in an off-state during the displayed time, without limiting the present disclosure in this respect.

Reference number 7 denotes a signal sequence of a first transfer signal which is in this embodiment synchronized with the illumination signal sequence 6. The first transfer signal drives a first transfer gate, wherein in response to this a reflection of the light pulses are measured in the times in which the first transfer signal is in an on-state.

Reference number 8 denotes a signal sequence of a second transfer signal after the first transfer signal which is set to an on-state until the first transfer signal is set into an on-state again. The second transfer signal drives a second transfer gate, wherein in response to this driving ambient light is measured in the times in which the second transfer signal is in an on-state. Moreover, it is possible to detect light which is reflected from an object, or the like, which is not detected within the application of the first transfer signal, i.e. is above a predetermined distance which the light is not able to cover (or to travel from the light source to the scene and back to the photo-detection element) within the time interval of the first transfer signal. However, in some embodiments, the second transfer signal is also used to dump charges, which are generated in response to the light pulse.

The diagrams 7 and 8 show a driving of a first and a second transfer gate according to an embodiment of the present disclosure (hereinafter referred to as mode 1). The driving of a first transfer gate, a second transfer gate, and an overflow gate are depicted under reference numbers 9, 10, and 11 of FIG. 1 (hereinafter referred to as mode 2).

In some embodiments, a switching between the mode 1 and the mode 2 is possible.

Reference number 9 denotes a signal sequence of a first transfer signal which is in this embodiment synchronized with the illumination signal sequence 6. The first transfer signal drives a first transfer gate, wherein in response to this a reflection of the light pulses are measured in the times in which the first transfer signal is in an on-state.

Reference number 10 shows a signal sequence of a second transfer signal after the first transfer signal which is set to an on-state as long as the first transfer signal. The second transfer signal drives a second transfer gate, wherein in response to this ambient light is measured in the times in which the second transfer signal is in an on-state. Moreover, it is possible to detect light which is reflected from an object, or the like, which is not detected within the first transfer signal active period, i.e. is above a predetermined distance which the light is not able to cover within the time interval of the first transfer signal, as mentioned above.

Reference number 11 denotes a signal sequence of an overflow signal which drives an overflow gate, wherein the signal duration is set to a predetermined value (e.g. higher, lower or equal to the signal duration of 9 or 10), such that the overflow signal is set to an off-state when the first transfer signal is set to an on-state again. The overflow signal is configured to dump charges which are produced by the detection of light, but are not used for a photo detection, or the like.

In summary, in the mode 2, as illustrated in FIG. 1 and as implemented in some embodiments, the first transfer gate is driven (by the first transfer signal) for the same amount of time as the second transfer gate (by the second transfer signal). However, the second transfer signal is starting after the second transfer signal has ended, which is known in the art as a phase shift of 180 degrees. The first transfer gate is configured to collect mainly the signal which is generated in response to a reflection of the emitted light pulse, whereas the second transfer gate is configured to collect mainly the signal which is generated by ambient light.

After the second transfer signal, an overflow signal starts, which drives the overflow gate until the application of the first transfer signal, and with that the whole cycle, starts again. The periodic operation of the signals is known in the art as a duty cycle. The overflow gate is configured to dump charges which are generated, but are not used for measuring a signal, such as charges generated because a photo-detection element, such as a photodiode, CMOS sensor, or the like, has not reached a ground state yet, or the like.

In the case of the mode 2, the overflow signal needs to have a similar bandwidth as the first transfer signal and the second transfer signal in some embodiments. However, requirements for the first transfer signal and the second transfer signal may be in some embodiments a high frequency, good symmetry and/or a good signal integrity. In some embodiments, it might be a challenge to add a third high frequency signal for driving the overflow gate without compromising the above requirements for the first transfer signal and a second transfer signal, and, thus, therefore, it is known that the overflow gate is driven with an overflow signal of a low frequency.

Figure 2:
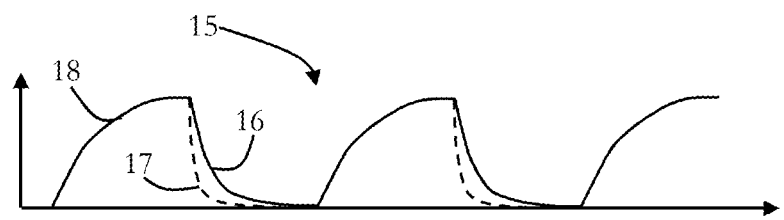
FIG. 2 depicts a graph of an overflow signal sequence of an overflow signal.

In order to drive the overflow gate in the way as it is described, the falling edge speed of the overflow signal needs to be increased in some embodiments, which is described under reference of FIG. 2.

FIG. 2 depicts a graph of an overflow signal sequence 15 of the overflow signal which is used to drive the overflow gate. The continuous line 16 shows a signal sequence as it is known in the art. The dashed line 17 at the falling edge shows a signal sequence as it is desired and achieved according to an embodiment to the present disclosure, as described above. The continuous line of the rising edge 18 is the same for the signal sequence known in the art and the signal sequence according to an embodiment of the present disclosure.

The continuous line 16, i.e. the falling edge speed, is limited by an RC member to which the overflow gate is coupled, as will be described under reference of FIG. 3.

Figure 3:
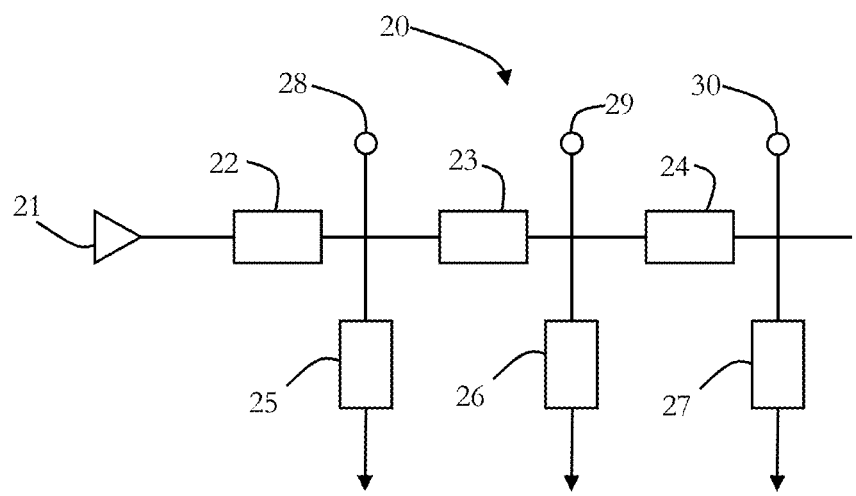
FIG. 3 depicts a circuitry as it is known in the art.

FIG. 3 depicts a circuitry 20 including an overflow gate driver 21, three resistors 22, 23 and 24, three capacitors 25, 26 and 27, and three overflow gates 28, 29, 30, wherein the number of each element is chosen for illustrational purposes only. The number of overflow gate drivers, overflow gates, resistors and capacitors may be different from the numbers depicted in FIG. 3.

As can be taken from the circuitry 20 structure of FIG. 3, the falling edge of each overflow gate 28, 29 and 30 is depending on the discharge rate of the capacitors 25, 26 and 27 and on the resistors 22, 23 and 24. Therefore, the overflow gate driver 21 may not be able to control the overflow gates 28, 29 and 30 faster than the capacitors 25, 26 and 27 are able to discharge.

An embodiment which provides a solution to overcome the discussed RC limitation is depicted and discussed under reference of FIG. 4.

FIG. 4 shows a circuitry 35 according to an embodiment of the present disclosure, including an overflow gate 36, a first transfer gate 37, a second transfer gate 38, a first transfer gate switch 39 and a second transfer gate switch 40.

In some embodiments, the circuitry 35 replaces parts of the circuitry 20 from FIG. 3. In other embodiments, the circuitry 35 is additionally coupled to one or several overflow gates.

The first transfer gate switch 39 is configured to react to a first transfer gate switch signal and couples or decouples, in response to the first transfer gate switch signal the overflow gate 36 to the first transfer gate, depending on the state the switch is in. That means, for example, if the first transfer gate switch 39 is in a coupled state, the first transfer gate switch signal causes the first transfer gate switch to be in a decoupled state and vice versa. The same applies to the second transfer gate switch 40.

With this configuration, a driving of the overflow gate 36 is possible as it is depicted with the dashed line 17 of FIG. 2.

With this configuration, the overflow gate 36 may be driven with at least one of the first transfer signal or the second transfer signal. For example, when the first (second) transfer signal is not used to drive the first (second) transfer gate 37 (38) anymore, the first (second) transfer gate switch signal causes the first (second) transfer gate 37 (38) to be coupled to the overflow gate 36, which ultimately enables the described mode 2 of FIG. 1.

It should be noted that only one overflow gate 36 is depicted in FIG. 4. However, also a plurality of transfer gates may be driven with this circuitry. A person skilled in the art may appreciate that the circuitry 35 may be enlarged, in order to drive a plurality of overflow gates with a plurality of transfer signals. For example, there may be three or more transfer gates driving the overflow gate 36. Also, there may be two, three (as in FIG. 3) or more transfer gates, which are each operated with at least one transfer signal, or the like.

Figure 5:
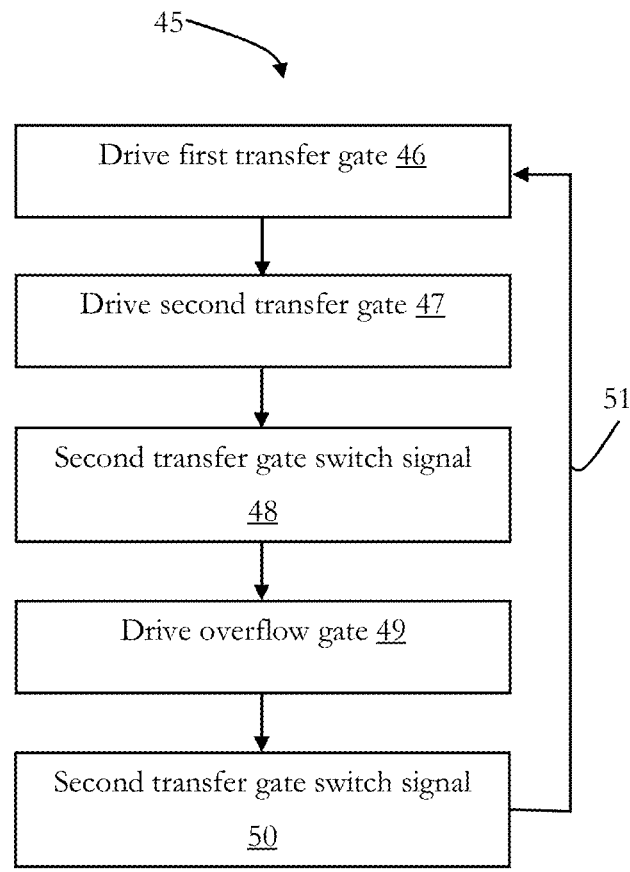
FIG. 5 shows a method for driving an overflow gate according to an embodiment of the present disclosure.

FIG. 5 shows a method 45 for driving an overflow gate (or a circuitry or imaging portion or time-of-flight device as described herein), such as the overflow gate 36, according to an embodiment of the present disclosure. The state of transfer gate switches, such as the transfer gate switches 39 and 40 are assumed to be in a decoupled state in the beginning.

At 46, the first transfer gate is driven for five nanoseconds. After that, the first transfer signal is turned off.

At 47, the seconds transfer gate is driven for five nanoseconds, wherein the second transfer signal stays turned on.

At 48, the second transfer gate switch signal sets the second transfer gate switch into a coupled state At 49, the overflow gate is driven with the second transfer signal for forty nanoseconds.

At 50, the second transfer gate switch signal sets the second transfer gate switch into a decoupled state.

At 51, the cycle starts from the beginning by driving the first transfer gate.

In this embodiment, the overflow gate is only driven with the second transfer signal. However, in other embodiments, the overflow gate is driven with the first transfer signal, whereas in other embodiments, the overflow gate is driven with both transfer signals.

Figure 6:
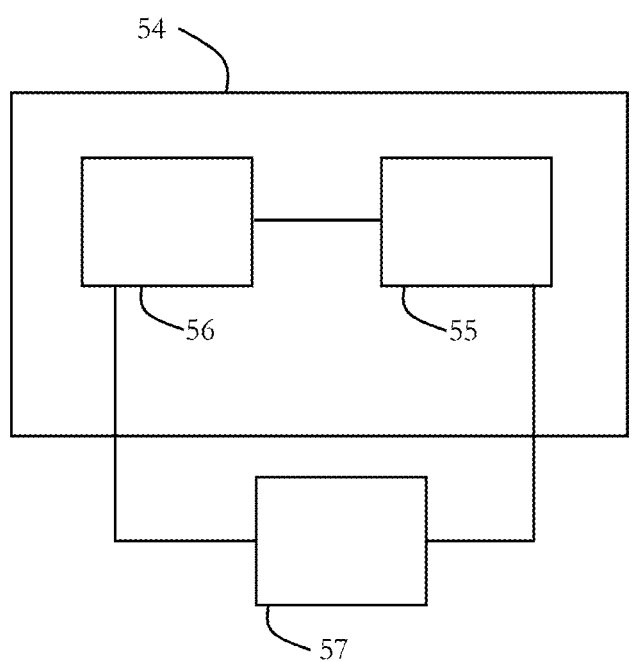
FIG. 6 shows an imaging portion according to an embodiment of the present disclosure.

FIG. 6 shows an imaging portion 54 according to an embodiment of the present disclosure. The imaging portion includes circuitry 55, such as the circuitry 35 as described herein, a photo-detection element 56, as described herein, and is connected to a processing unit 57.

The circuitry 55 and the photo-detection element 56 are connected to each other, which means that charges generated in the photo-detection element, for example by a photo-detection process, or the like, may be transferred to the circuitry 55 where a process according to an embodiment of the present disclosure is performed.

The processing unit 57 is generally configured to perform methods according to embodiments of the present disclosure, such as the method 45, as described herein. In this embodiment, the processing unit 57 is configured to send signals and to time the process and the elements according to an embodiment of the present disclosure. For example, the processing unit 57 is configured to control the photo-detection element to perform a photo-detection process or the like at specific points of time. The processing unit 57 is further configured to control the first transfer signal, the second transfer signal, the first transfer gate switch signal, the second transfer gate switch signal, or the like. In embodiments, which additionally include an overflow gate driver as described with reference to FIG. 3, or the like, the processing unit 57 may also be configured to control the overflow gate driver.

Figure 7:
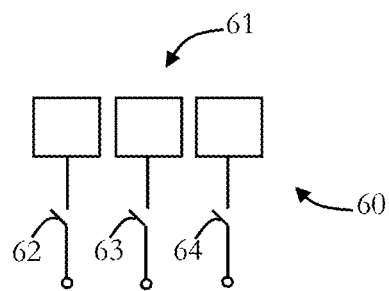
FIG. 7 shows an imaging portion according to an embodiment of the present disclosure.

FIG. 7 shows an imaging portion 60 according to an embodiment of the present disclosure. The imaging portion 60 includes an array 61 of photo-detection elements. For illustrational purposes, in this embodiment, the number of photo-detection elements included in the array is chosen to be three. However, also two or any number larger than three are chosen in other embodiments. The imaging portion 60 further includes three transfer gate switches 62 to 64, wherein each transfer gate switch 62 to 64 is associated to a photo-detection element of the array of photo-detection elements 61. The transfer gate switches are configured to be controlled separately from each other. For example, the transfer gate switch 62 may be in a coupled state, wherein the transfer gate switches 63 and 64 are in a decoupled state and vice versa.

Also, in some embodiments, the photo-detection elements of the array 61 represent pixels and a transfer gate switch, such as the transfer gate switch 62, is coupled to odd pixels (i.e. the first, third, fifth, and so on) and another transfer gate, such as the transfer gate 63, is coupled to even pixel (i.e. the second, fourth, sixth, and so on).

Figure 8:
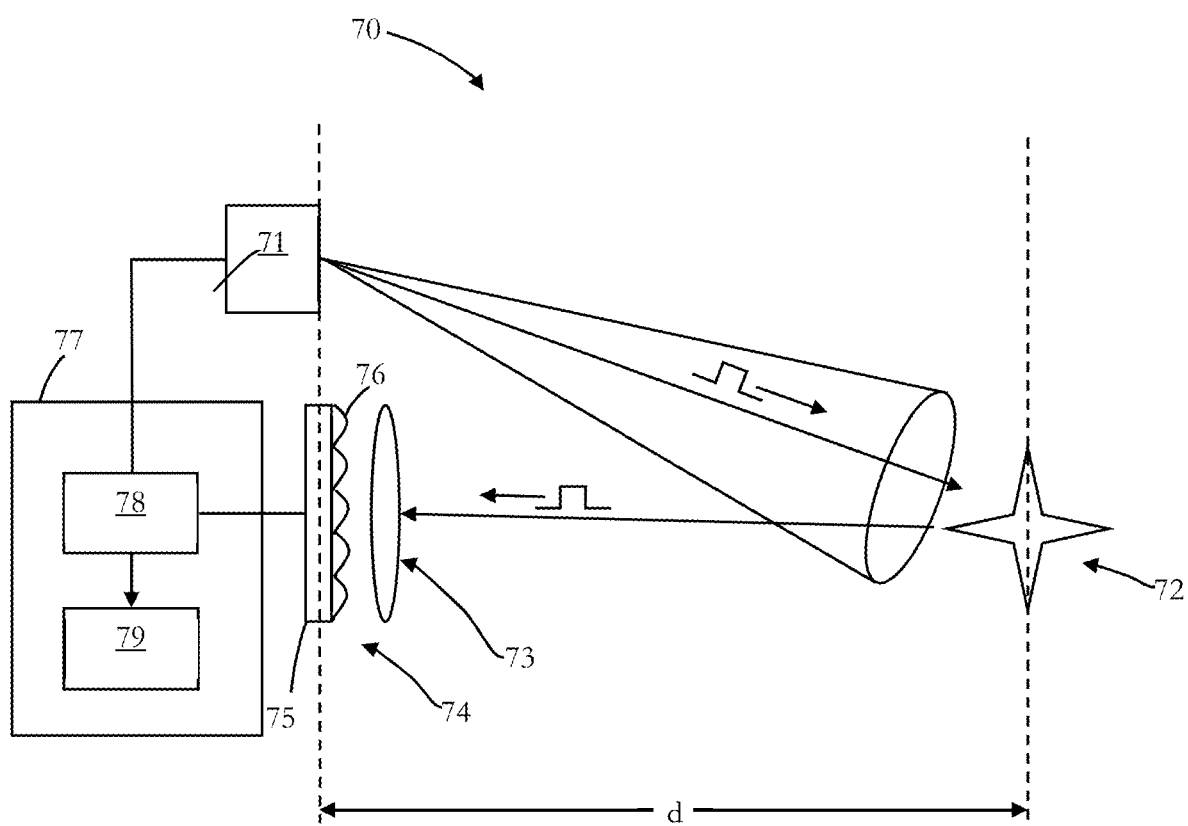
FIG. 8 shows an embodiment of a time-of-flight (ToF) device.

Referring to FIG. 8, there is illustrated an embodiment of a time-of-flight (ToF) device 70, which can be used for depth sensing or providing a distance measurement, in particular for the technology as discussed herein. The ToF device 70 has a circuitry 77 which is configured to perform the methods as discussed herein and which forms a control of the ToF device 70 (and it includes, not shown, corresponding processors, memory and storage as it is generally known to the skilled person).

The ToF device 70 has a pulsed light source 71 and it includes light emitting elements (based on laser diodes), wherein in the present embodiment, the light emitting elements are narrow band laser elements.

The light source 71 emits pulsed light, i.e. pulse density modulates light pulses, as discussed herein, to a scene 72 (region of interest or object), which reflects the light. By repeatedly emitting light to the scene 72, the scene 72 can be scanned, as it is generally known to the skilled person. The reflected light is focused by an optical stack 73 to a light detector 74.

The light detector 74 has an image sensor 75, which is implemented based on multiple CAPDs formed in an array of pixels and a microlens array 76 which focuses the light reflected from the scene 72 to the image sensor 75 (to each pixel of the image sensor 75).

The light emission time and modulation information is fed to the circuitry or control 77 including a time-of-flight measurement unit 78, which also receives respective information from the image sensor 75, when the light is detected which is reflected from the scene 72. On the basis of the light waveform represented by the emitted pulse density modulated light pulses received from the light source 71 and the performed demodulation, the time-of-flight measurement unit 78 computes a phase shift of the received light pulses which have been emitted from the light source 71 and reflected by the scene 72 and on the basis thereon it computes a distance d (depth information) between the image sensor 75 and the scene 72, as also discussed above.

The depth information is fed from the time-of-flight measurement unit 78 to a 3D image reconstruction unit 79 of the circuitry 77, which reconstructs (generates) a 3D image of the scene 72 based on the depth information received from the time-of-flight measurement unit 78.

Figure 9:
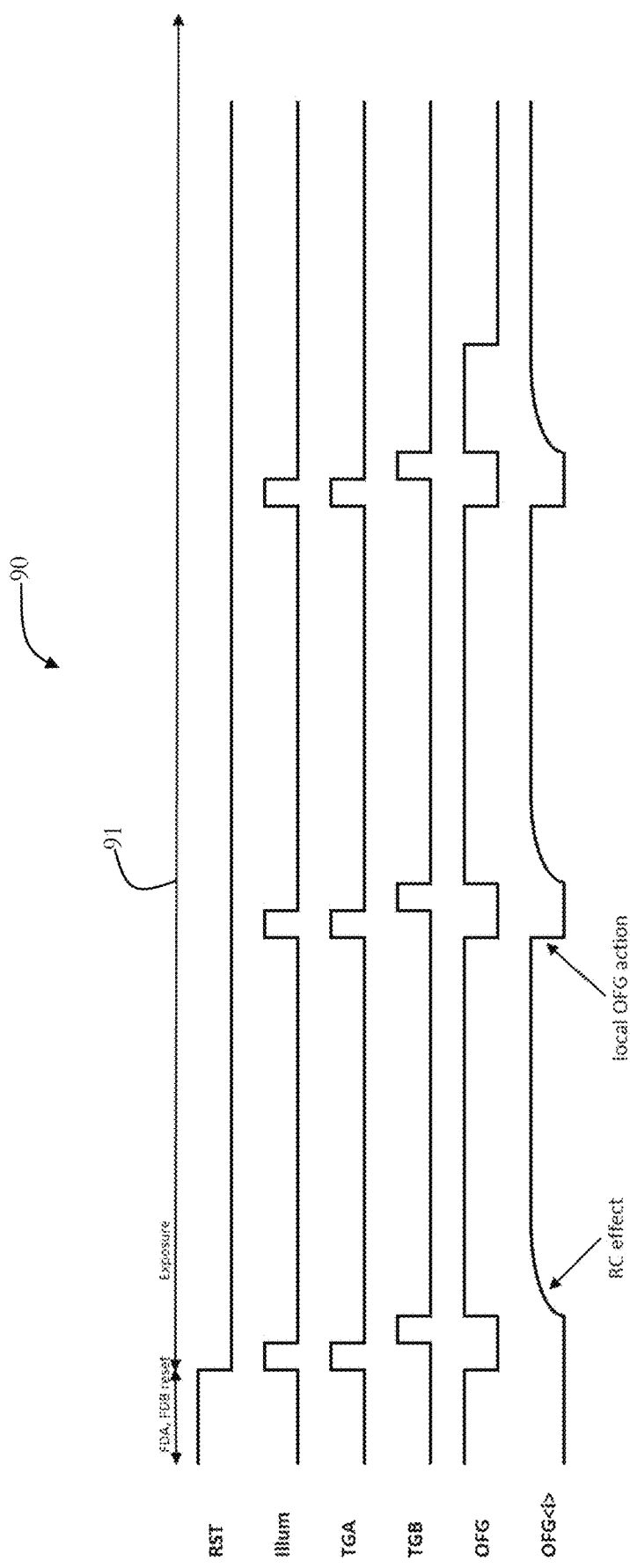
FIG. 9 shows a timing diagram according to an embodiment of the present disclosure.

FIG. 9 shows a timing diagram 90 for driving an imaging portion (e.g. according to FIG. 6) and/or a circuitry (e.g. according to FIG. 4) according to an embodiment of the present disclosure. A horizontal axis 91 corresponds to a time, wherein a time value increases from left to right.

In a first time interval (first double arrow of the horizontal axis 91 with text "FDA, FDB, reset", wherein FDA is a signal for a floating diffusion of TGA and FDB is a signal for a floating diffusion of TGB, wherein TGA is a transfer gate A (e.g. first transfer gate 37 of FIG. 4) and TGB is a transfer gate B (e.g. second transfer gate 38 of FIG. 4), a reset signal RST is turned on for a first predetermined amount of time, setting the system including different gates of a Gate type pixel in a predetermined (initial) state.

After that, an exposure cycle starts (second double arrow of the horizontal axis 91), wherein at first an illumination signal Illum and a first transfer signal TGA are turned on for a first predetermined amount of time (e.g. 5 ns), wherein the predetermined amount of time is the same for the illumination signal Illum and for the first transfer signal TGA.

After the illumination signal Illum and the first transfer signal TGA are turned off, a second transfer signal TGB is turned on for the second predetermined amount of time (e.g. 5 ns).

After the second transfer signal TGB is turned off, an overflow signal OFG is turned on for a third predetermined amount of time (e.g. 45 ns), which is, in this embodiment, longer than the second predetermined amount of time.

After the overflow signal OFG is turned off, the exposure cycle starts again.

For comparison, an overflow signal OFG<i> is depicted, illustrating a driving of an overflow gate, according to another embodiment of the present disclosure, wherein the starting of the overflow signal OFG<i> corresponds to a charging of a capacitor (RC effect) and the ending of the overflow signal OFG<i> is performed by a transfer gate switch according to the present disclosure.

The methods as described herein are also implemented in some embodiments as a computer program causing a computer or a processor to perform the method, when being carried out on the computer and/or processor. In some embodiments, also a non-transitory computerreadable recording medium is provided that stores therein a computer program product, which, when executed by a processor, such as the processor described above, causes the methods described herein to be performed.

It should be recognized that the embodiments describe methods with an exemplary ordering of method steps. The specific ordering of method steps is however given for illustrative purposes only and should not be construed as binding. For example the ordering of 46 and 47 in the embodiment of FIG. 5 may be exchanged. Other changes of the ordering of method steps may be apparent to the skilled person.

Please note that the division of the imaging portion 55 into units 35, and 57 is only made for illustration purposes and that the present disclosure is not limited to any specific division of functions in specific units. For instance, the imaging portion 55 could be implemented by a respective programmed processor, field programmable gate array (FPGA) and the like.

In some embodiments, also a non-transitory computer-readable recording medium is provided that stores therein a computer program product, which, when executed by a processor, such as the processor described above, causes the method described to be performed.

All units and entities described in this specification and claimed in the appended claims can, if not stated otherwise, be implemented as integrated circuit logic, for example on a chip, and functionality provided by such units and entities can, if not stated otherwise, be implemented by software.

In so far as the embodiments of the disclosure described above are implemented, at least in part, using software-controlled data processing apparatus, it will be appreciated that a computer program providing such software control and a transmission, storage or other medium by which such a computer program is provided are envisaged as aspects of the present disclosure.

Note that the present technology can also be configured as described below.

(1) An imaging portion for a time-of-flight device, comprising:
at least one photo-detection element;
at least one overflow gate for the at least one photo-detection element;
at least one transfer gate configured to receive at least one transfer signal;
at least one transfer gate switch configured to couple or to decouple the at least one overflow gate and the at least one transfer gate in response to at least one transfer gate switch signal.

(2) The imaging portion of (1), wherein the at least one overflow gate is driven with the at least one transfer signal.

(3) The imaging portion of anyone of (1) or (2), wherein the at least one transfer gate switch signal is based on the at least one transfer signal.

(4) The imaging portion of anyone of (1) to (3), wherein
a first and a second transfer gate are provided; and
a first and a second transfer gate switch are provided, wherein the first transfer gate switch is coupled to the first transfer gate and the second transfer gate switch is coupled to the second transfer gate; and wherein the first transfer gate switch and the second transfer gate switch are coupled to the at least one overflow gate.

(5) The imaging portion of anyone of (1) to (4), wherein the first transfer gate is coupled, by the first transfer gate switch, to the at least one overflow gate when the second transfer gate is decoupled from the at least one overflow gate; and the second transfer gate is coupled, by the second transfer gate switch, to the at least one overflow gate when the first transfer gate is decoupled from the overflow gate.

(6) The imaging portion of anyone of (1) to (5), wherein a first transfer signal is applied to the at least one overflow gate when the first transfer gate is coupled to the at least one overflow gate; and a second transfer signal is applied to the at least one overflow gate when the second transfer gate is coupled to the at least one overflow gate.

(7) The imaging portion of anyone of (1) to (6), wherein the first transfer gate is coupled to the at least one overflow gate after a first predetermined amount of time after the second transfer gate has been decoupled from the at least one overflow gate; and the second transfer gate is coupled to the at least one overflow gate after a second predetermined amount of time after the first transfer gate has been decoupled from the at least one overflow gate.

(8) The imaging portion of anyone of (1) to (7), comprising a plurality of photo-detection elements being arranged in an array.

(9) The imaging portion of anyone of (1) to (8), wherein for each of the photo-detection elements a transfer gate switch is provided.

(10) The imaging portion of anyone of (1) to (8), wherein for a group of photo-detection elements each a transfer gate switch is provided.

(11) A time-of-flight device, comprising:
an imaging portion including:
at least one photo-detection element;

at least one overflow gate for the at least one photo-detection element;
at least one transfer gate configured to receive at least one transfer signal;
at least one transfer gate switch configured to couple the at least one overflow gate and the at least one transfer gate in response to at least one transfer gate switch signal; and
a control configured to generate the at least one transfer gate switch signal for driving the at least one transfer gate switch.

(12) A method for operating an imaging portion for a time-of-flight device, the imaging portion including:
at least one photo-detection element;
at least one overflow gate for the at least one photo-detection element;
at least one transfer gate configured to receive at least one transfer signal; and
at least one transfer gate switch configured to couple the at least one overflow gate and the at least one transfer gate,
the method comprising:
applying at least one transfer signal to the at least one transfer gate; and
applying at least one transfer gate switch signal to the at least one transfer gate switch for coupling the at least one overflow gate and the at least one transfer gate.

(13) The method of (12), further comprising applying at least one transfer signal to the at least one overflow gate.

(14) The method of anyone of (12) or (13), wherein the at least one transfer gate switch signal is based on the at least one transfer signal.

(15) The method of anyone of (12) to (14), wherein the imaging portion includes a first and a second transfer gate, and a first and a second transfer gate switch, wherein the method further comprises:
coupling the first transfer gate switch to the first transfer gate and the second transfer gate switch to the second transfer gate; and
coupling the first transfer gate switch and the second transfer gate switch to the at least one overflow gate.

(16) The method of anyone of (12) to (15), further comprising:
coupling the first transfer gate to the at least one overflow gate when the second transfer gate is decoupled from the at least one overflow gate; and
coupling the second transfer gate to the at least one overflow gate when the first transfer gate is decoupled from the at least one overflow gate.

(17) The method of anyone of (12) to (16), further comprising:
driving the at least one overflow gate when the first transfer gate is coupled to the at least one overflow gate; and
driving the at least one overflow gate when the second transfer gate is coupled to the at least one overflow gate.

(18) The method of anyone of (12) to (17), further comprising:
coupling the first transfer gate to the at least one overflow gate after a first predetermined amount of time after the second transfer gate has been decoupled from the at least one overflow gate; and
coupling the second transfer gate to the at least one overflow gate after a second predetermined amount of time after the first transfer gate has been decoupled from the at least one overflow gate.

(19) The method of anyone of (12) to (18), wherein the imaging portion includes a plurality of photo-detection elements being arranged in an array, and wherein for each of the photo-detection elements a transfer gate switch is provided.

(20) The method of anyone of (12) to (18), wherein the imaging portion includes a plurality of photo-detection elements being arranged in an array, and wherein for a group of photo-detection elements each a transfer gate switch is provided.

(21) A computer program comprising program code causing a computer to perform the method according to anyone of (12) to (20), when being carried out on a computer.

(22) A non-transitory computer-readable recording medium that stores therein a computer program product, which, when executed by a processor, causes the method according to anyone of (12) to (20) to be performed.

The invention claimed is:

1. An imaging portion for a time-of-flight device, comprising:
at least one photo-detection element;
at least one overflow gate for the at least one photo-detection element;
at least one transfer gate configured to receive at least one transfer signal; and
at least one transfer gate switch configured to couple the at least one overflow gate and the at least one transfer gate in response to at least one transfer gate switch signal.

2. The imaging portion of claim 1, wherein the at least one overflow gate is driven with the at least one transfer signal.

3. The imaging portion of claim 1, wherein the at least one transfer gate switch signal is based on the at least one transfer signal.

4. The imaging portion of claim 1, wherein
a first and a second transfer gate are provided; and
a first and a second transfer gate switch are provided, wherein the first transfer gate switch is coupled to the first transfer gate and the second transfer gate switch is coupled to the second transfer gate; and wherein the first transfer gate switch and the second transfer gate switch are coupled to the at least one overflow gate.

5. The imaging portion of claim 4, wherein the first transfer gate is coupled, by the first transfer gate switch, to the at least one overflow gate when the second transfer gate is decoupled from the at least one overflow gate; and the second transfer gate is coupled, by the second transfer gate switch, to the at least one overflow gate when the first transfer gate is decoupled from the overflow gate.

6. The imaging portion of claim 5, wherein a first transfer signal is applied to the at least one overflow gate when the first transfer gate is coupled to the at least one overflow gate; and a second transfer signal is applied to the at least one overflow gate when the second transfer gate is coupled to the at least one overflow gate.

7. The imaging portion of claim 5, wherein the first transfer gate is coupled to the at least one overflow gate after a first predetermined amount of time after the second transfer gate has been decoupled from the at least one overflow gate; and the second transfer gate is coupled to the at least one overflow gate after a second predetermined amount of time after the first transfer gate has been decoupled from the at least one overflow gate.

8. The imaging portion of claim 1, comprising a plurality of photo-detection elements being arranged in an array.

9. The imaging portion of claim 8, wherein for each of the photo-detection elements a transfer gate switch is provided.

10. The imaging portion of claim 8, wherein for a group of photo-detection elements each a transfer gate switch is provided.

11. A time-of-flight device, comprising:
an imaging portion including:
at least one photo-detection element;
at least one overflow gate for the at least one photo-detection element;
at least one transfer gate configured to receive at least one transfer signal;
at least one transfer gate switch configured to couple the at least one overflow gate and the at least one transfer gate in response to at least one transfer gate switch signal; and
a control configured to generate the at least one transfer gate switch signal for driving the at least one transfer gate switch.

12. A method for operating an imaging portion for a time-of-flight device, the imaging portion including:
at least one photo-detection element;
at least one overflow gate for the at least one photo-detection element;
at least one transfer gate configured to receive at least one transfer signal; and
at least one transfer gate switch configured to couple the at least one overflow gate and the at least one transfer gate,
the method comprising:
applying at least one transfer signal to the at least one transfer gate; and
applying at least one transfer gate switch signal to the at least one transfer gate switch for coupling the at least one overflow gate and the at least one transfer gate.

13. The method of claim 12, further comprising applying at least one transfer signal to the at least one overflow gate.

14. The method of claim 12, wherein the at least one transfer gate switch signal is based on the at least one transfer signal.

15. The method of claim 12, wherein the imaging portion includes a first and a second transfer gate, and a first and a second transfer gate switch, wherein the method further comprises:
coupling the first transfer gate switch to the first transfer gate and the second transfer gate switch to the second transfer gate; and
coupling the first transfer gate switch and the second transfer gate switch to the at least one overflow gate.

16. The method of claim 15, further comprising:
coupling the first transfer gate to the at least one overflow gate when the second transfer gate is decoupled from the at least one overflow gate; and
coupling the second transfer gate to the at least one overflow gate when the first transfer gate is decoupled from the at least one overflow gate.

17. The method of claim 16, further comprising:
driving the at least one overflow gate when the first transfer gate is coupled to the at least one overflow gate; and
driving the at least one overflow gate when the second transfer gate is coupled to the at least one overflow gate.

18. The method of claim 16, further comprising:
coupling the first transfer gate to the at least one overflow gate after a first predetermined amount of time after the second transfer gate has been decoupled from the at least one overflow gate; and
coupling the second transfer gate to the at least one overflow gate after a second predetermined amount of time after the first transfer gate has been decoupled from the at least one overflow gate.

19. The method of claim 12, wherein the imaging portion includes a plurality of photo-detection elements being arranged in an array, and wherein for each of the photo-detection elements a transfer gate switch is provided.

20. The method of claim 12, wherein the imaging portion includes a plurality of photo-detection elements being arranged in an array, and wherein for a group of photo-detection elements each a transfer gate switch is provided.

* * * * *